356-400

XR 3,941,980

United States Patent
Okamoto et al.

[11] 3,941,980
[45] Mar. 2, 1976

[54] SCANNING PHOTOELECTRIC MICROSCOPE

[75] Inventors: Keiichi Okamoto; Yoshio Matsumoto, both of Yokohama; Yasujiro Oshima, Tokyo, all of Japan

[73] Assignees: Hitachi, Ltd.; Yasujiro Oshima, both of Japan

[22] Filed: Oct. 11, 1973

[21] Appl. No.: 405,269

[30] Foreign Application Priority Data
Oct. 13, 1972  Japan............................... 47-101874

[52] U.S. Cl. ...... 235/92 GC; 235/92 V; 235/92 MP; 235/92 R; 250/557; 356/172
[51] Int. Cl.²......................................... G01B 11/26
[58] Field of Search ........ 235/92 MP, 92 V, 92 EV, 235/92 FQ, 92 DN, 92 T, 92 GC; 318/603, 640; 350/112; 356/172, 156; 250/557

[56] References Cited
UNITED STATES PATENTS

| | | | |
|---|---|---|---|
| 3,299,272 | 1/1967 | Furukawa | 235/92 V |
| 3,560,097 | 2/1971 | Gavrilkin et al. | 356/172 |
| 3,588,462 | 6/1971 | Kreckel et al. | 235/92 GC |
| 3,609,307 | 9/1971 | Totsuka | 235/92 MP |
| 3,614,455 | 10/1971 | Paulus | 250/557 |
| 3,678,252 | 7/1972 | Payne | 235/92 EV |
| 3,692,413 | 9/1972 | Marcy et al. | 356/172 |
| 3,731,064 | 5/1973 | Berler | 235/92 V |
| 3,796,497 | 3/1974 | Mathisen et al. | 356/172 |

*Primary Examiner*—Joseph M. Thesz
*Attorney, Agent, or Firm*—Craig & Antonelli

[57] ABSTRACT

The present invention discloses a scanning photoelectric microscope in which a first reference object to be measured which is mounted on a stationary support is disposed relative to a second object to be measured which is disposed on a slidable table so as to form on both sides of the first object to be measured two indication intervals, which are caused to coincide with each other for alignment. The scanning photoelectric microscope according to the present invention comprises a scanning device for scanning an image reflected from the two indication intervals formed by the first and second objects to be measured at a constant speed to effect parallel displacement, a marker device for detecting positions of a scanned image corresponding to those of motion of the scanning device, and a circuit for detecting the two indication intervals detected by the scanning device in terms of time in response to a signal from the marker device, the second object to be measured being shifted until the two indication intervals coincide with each other.

18 Claims, 12 Drawing Figures

FIG. I PRIOR ART
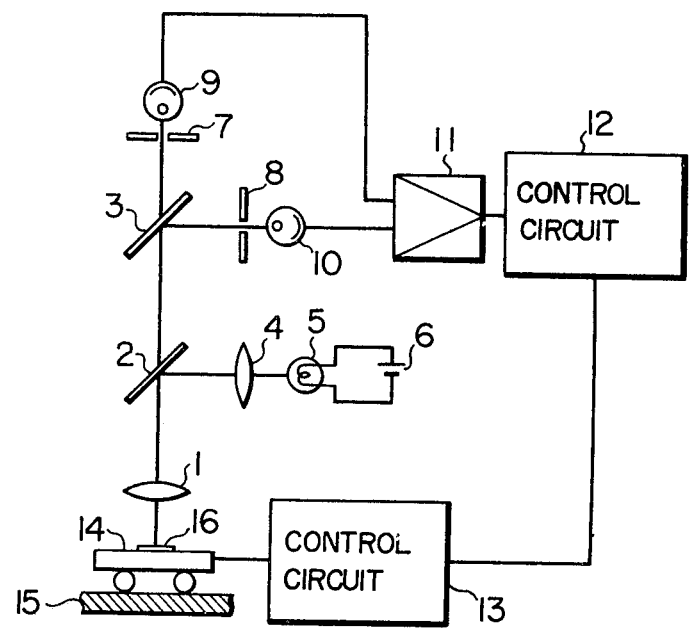
FIG. 2 PRIOR ART
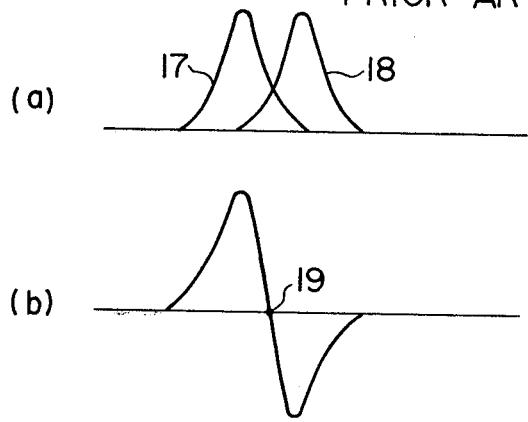

SCANNING PHOTOELECTRIC MICROSCOPE

The present invention relates to a scanning photoelectric microscope, and more particularly to a scanning photoelectric microscope in which an image reflected from an object to be measured is scanned so that a photoelectric element may detect the scanned image through a slit to measure indication intervals of the object to be measured.

In the following, a device according to the present invention will be fully described in comparison with conventional devices in connection with the accompanying drawings, in which:

FIG. 1 is an arrangement view showing a conventional slit type photoelectric microscope;

FIG. 2 is a view showing waveforms of an input signal to and output signal from a differential amplifier in the slit type photoelectric microscope of FIG. 1;

Figure 3:
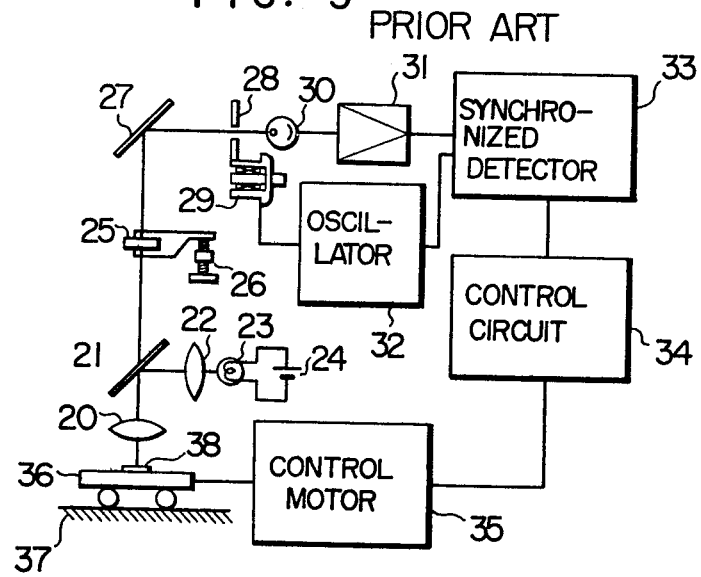
FIG. 3 is an arrangement view showing a photoelectric microscope in which a conventional vibrator is used.
Figure 4:
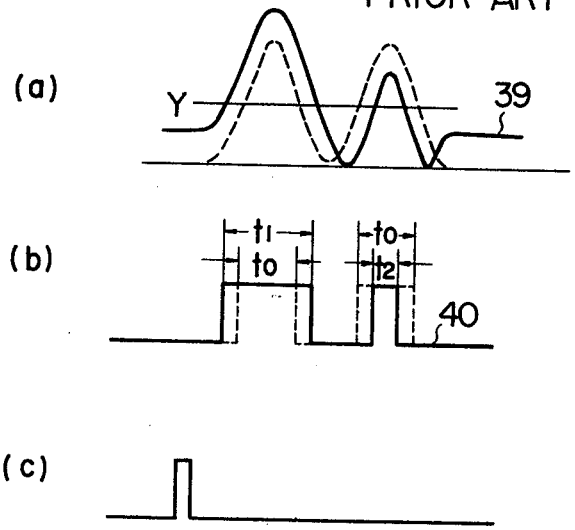
FIG. 4 is a view showing waveforms of an output signal from an amplifier of the photoelectric microscope of FIG. 3, a signal generated by shaping the output signal, and an output signal from an oscillator thereof.

Conventional microscopes have been of such a construction that a scale on a standard measure of an object to be measured is read out by photoelectric elements so as to come into alignment with a reference line or reference slit. One example of them will be described in connection with FIGS. 1 to 4. A microscope constructed as a slit type is shown in FIG. 1 with the waveforms therefor being shown in FIG. 2, has a light source 5 which is energized by a power supply 6. Light emanating from the light source, passing through a converging lens 4, is reflected on the surface of a semitransparent mirror 2 and then passes through an objective 1 to irradiate the standard measure of an object 16 to be measured. The light, after irradiation, is converted to reflected light passing through the objective 1 and the semitransparent mirror 2 to a semitransparent mirror 3. A portion of the reflected light passes through the semitransparent mirror 3 and a slit 7 to a photoelectric element 9, which converts the reflected light to electric signals to detect a portion thereof. The other portion of the reflected light is, on the other hand, reflected on the semitransparent mirror 3 and passes through a slit 8 to a photoelectric element 10 for conversion to electric signals to detect the other portion of the reflected light. The electric signals detected by the respective photoelectric elements 9, 10 are transmitted to a differential amplifier 11 for differential amplification and then transmitted to a control circuit 12, the signal from which drives a control motor 13 to displace a slider 14 movably supported on a base 15 and an object 16 to be measured which is mounted on the slider. In this case, the slits 7 and 8 are of the same shape and disposed in phase shifted relationship. Accordingly, the displacement of the scale on the standard measure of the object to be measured permits output waveforms 17 and 18 as shown in (a) of FIG. 2 to be generated from the photoelectric elements 9 and 10, respectively, and an output waveform as shown in (b) of FIG. 2 to be generated from the differential amplifier 11. The scale on the standard measure of the object 16 to be measured is permitted to be read out by controlling the control circuit 12 so that the scale on the standard measure thereof may be positioned at a middle point 19 of the output waveform from the differential amplifier 11, that is to say, at a point at which the same outputs are generated from the photoelectric elements 9 and 10. A microscope as shown in FIGS. 3 and 4 detects the reflected image using a vibrator. A light source 23 is powered by a power supply 24, and light emanating therefrom passes through a converging lens 22 and is then reflected on a semitransparent mirror 21, then passing through an objective 20 to irradiate an object 38 to be measured. The light, after irradiation, is converted to reflected light, which passes through the objective 20, the semitransparent mirror 21, and balancing parallel prism 25 and is then reflected by a mirror 27 to a vibrating slit 28. The balancing parallel prism 25 are connected to an adjusting screw 26, which adjusts the reflected light so as to be disposed at the center of the slit 28. On the other hand, the vibrating slit 28 is fixedly mounted on an armature of a vibrator 29 vibrating at the frequency defined by an oscillator 32. The reflected light reaching the vibrating slit 28 passes through the gap thereof to a photoelectric element 30, from which electric signals are generated depending upon reflection. The electric signal is amplified by an amplifier 31 and then transmitted to a synchronized detector 33. The synchronized detector 33 synchronously rectifies the transmitted signal to derive therefrom a deviation signal, which is then transmitted to a control circuit 34. The control circuit 34 controls the deviation signal from the synchronized detector 33 to drive a control motor 35 for displacing a slider 36 on which the object 38 to be measured is placed. The slider 36 is movably supported on a base 37. The waveform of output from the amplifier 31 through the photoelectric element 30 appears to take an output waveform 39 as shown in (a) of FIG. 4 in response to the displacement of the scale on the standard measure of the object 38 to be measured. The rectification of the output waveform 39 at an output level of Y permits rectangular waves 40 as shown in (b)

of FIG. 4 to be generated in the synchronized detector 33. Further, the synchronized detector 33 initiates the synchronized detection in response to a signal from the oscillator 32 as shown in (c) of FIG. 4 to derive therefrom a deviation time $t_3$ between durations $t_1$ and $t_2$ of the rectangular waves 40. The signal of the deviation time $t_3$ is transmitted to the control circuit 34, under the control of which the standard measure of the object to be measured is displaced. After the displacement, the above operations are repeated until the deviation time $t_3$ becomes zero. When the deviation time $t_3$ becomes zero, the output waveform transmitted from the amplifier to the synchronized detector 33 takes the form as shown by a dotted line in (a) of FIG. 4, which is rectified in the synchronized detector 33 to take rectangular waves as indicated by a dotted line in (b) of FIG. 4 with the durations $t_1$ and $t_2$ becoming $t_0$.

All the conventional microscopes as mentioned above permitted the standard measure scale (line or boundary) on the object to be measured to be read to bring it into accurate alignment with the reference line or reference slit provided in the microscope, but did not permit an interval between the scales to be read out.

Figure 5:
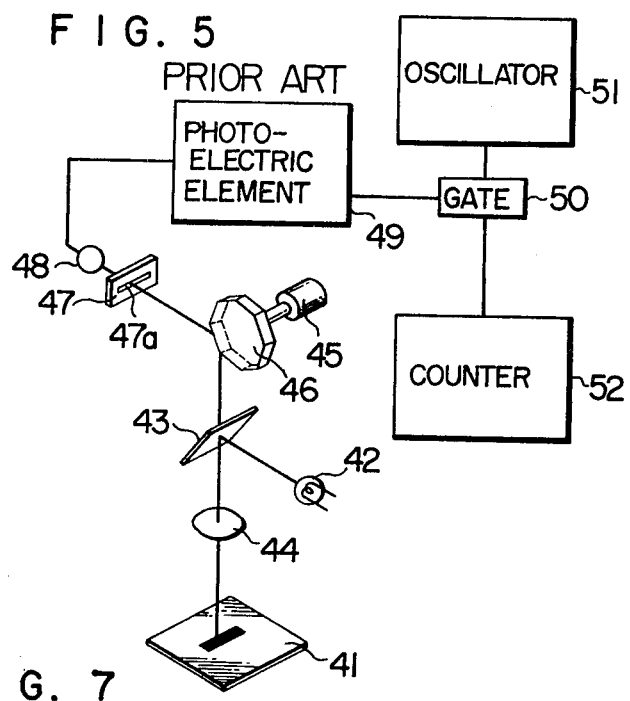
FIG. 5 is an arrangement view showing a scanning photoelectric microscope in which a conventional flat mirror is used.
Figure 7:
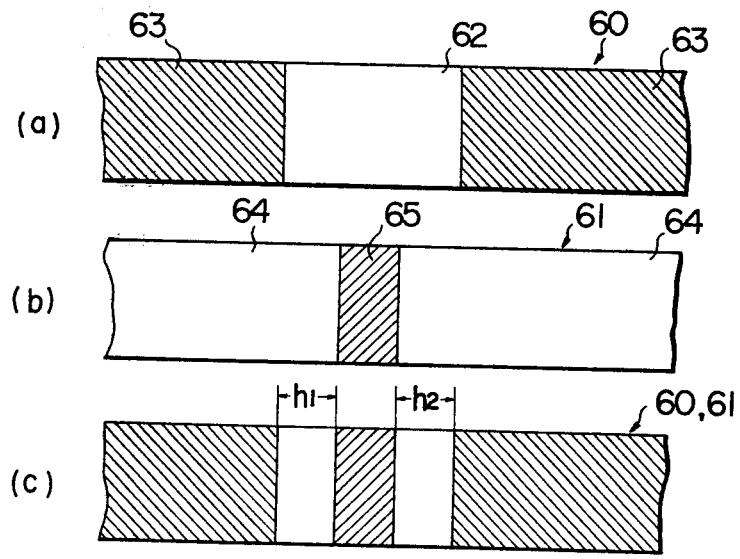
FIG. 7 is views showing patterns used in the scanning photoelectric microscope of FIG. 6, including a pattern for alignment of a first object to be measured, a pattern for alignment of a second object to be measured, and a pattern obtained when the first object to be measured is superimposed on the second object to be measured to form two indication intervals.

On the other hand, a conventional scanning photoelectric microscope in which there has been used a rotating flat mirror device serving as a scanning mechanism is shown in FIG. 5, in which an object 41 to be measured is formed with a rectangular dark mark and disposed at the lower portion of the scanning photoelectric microscope. The scanning photoelectric microscope comprises a light source 42, an objective 44, a flat mirror assembly 46 including a polygonal column and receiving revolution through a drive means 45, a slit 47, a photoelectric element 48, an amplifier and shaping circuit unit 49, a gate circuit 50, an oscillator 51 and a counter 52. In the scanning microscope, light emanating from the light source 42 is reflected by the semitransparent mirror 43 to irradiate the surface of the object 41 to be measured through the objective 44. The light, after irradiation, is converted at the surface of the object 41 to be measured to reflected light, which passes through the objective 44 and the semitransparent 43 to the surface of the flat mirror assembly 46. The incident light is reflected and scanned on the surface of the flat mirror assembly 46 receiving revolution through the drive means 45, and the light then passes through a gap 47a of the slit 47 to the photoelectric element 48. The amplifier and shaping circuit unit 49 receives an electric signal from the photoelectric element 48 in response to a light variation occurring when the photoelectric element 48 detects the edge of the mark on the object 41 to be measured. The signal, after being amplified and shaped, is applied to the gate circuit 50 to operate the latter, whereupon a pulse signal of high frequency from the oscillator 51 is applied to the counter 52 which initiates the counting of the pulses thereupon. After then, the amplifier and shaping circuit unit 49 receives another electric signal from the photoelectric element 48 in response to the light variation occurring when the element 48 detects the other edge of the mark on the object 41 to be measured. The signal is amplified and shaped to close the gate circuit 50. This causes the pulse signal of high frequency from the oscillator 51 to be prevented from being applied to the counter 52. The count in the counter 52 is proportional to a width along one direction of the mark on the object to be measured, thus measuring the dimension of the mark on the object to be measured. Such a scanning microscope permits the dimension of the mark (indication interval) on the object to be measured to be measured in terms of time, but any scanning microscope doesn't permit the difference between relative indication intervals of two objects to be measured to be detected for alignment between the two objects to be measured.

A primary object of the present invention is to provide a scanning photoelectric microscope in which an optical image reflected from a plurality of indication intervals formed by superimposing a first object to be measured on a second object to be measured is scanned by a scanning device to detect the difference between said plurality of indication intervals, which is made zero to bring the first object to be measured in alignment with the second object to be measured with accuracy by means of simple control circuits.

Another object of the present invention is to provide a scanning photoelectric microscope in which an optical image reflected from a plurality of indication intervals formed by superimposing a first object to be measured on a second object to be measured is scanned by passing it through a prism rotating at a constant speed to effect parallel displacement of the scanned and reflected optical image by means of a simplified scanning device, the speed of the parallel displacement thereof being small as compared with the speed of rotation of the prism with the result of the scanning of high accuracy.

A further another object of the present invention is to provide a scanning photoelectric microscope in which a binary counter and a reversible counter are reset in response to marker signals from a marker device for detecting positions of rotation of a scanning device to generate gate signals corresponding to a plurality of indication intervals as well as to detect the difference between durations of the gate signals for accurate alignment between first and second objects to be measured.

A still another object of the present invention is to provide a scanning photoelectric microscope in which a pulse motor is employed as a drive motor for shifting a table on which a second object to be measured is disposed, and a variable frequency oscillator is connected to a pulse motor amplifier serving as a drive circuit for the pulse motor to control the drive speed of the pulse motor in dependence on a positional deviation of a first object to be measured from a second object to be measured for accurate alignment therebetween in a short time.

A still another object of the present invention is to provide a scanning photoelectric microscope in which a decision circuit is provided with an dead zone therein against an output signal of the difference between a plurality of indication intervals in order to prevent it from hunting upon alignment between first and second objects to be measured.

The present invention is intended to provide a scanning photoelectric microscope adapted for use in measuring indication intervals of an object to be measured in terms of time, comprising first means for arranging a first object to be measured which is mounted on a stationary support and a second object to be measured which is disposed on a slidable table in slightly spaced apart and superimposed relationship to form a plurality of indication intervals in association with said first and second objects to be measured, a scanning device for scanning a reflected image from the indication intervals in said first means by passing through a polygonal prism having parallel surfaces and rotating said prism at a constant speed to effect parallel displacement, second means for detecting scanned and reflected images from said scanning device through a slit by means of a photoelectric element to convert it to an electric signal, third means for amplifying and shaping said signal from said second means to generate gate signals each corresponding to said plurality of indication intervals, a marker device for generating a signal each time when the surface to be scanned of said scanning device is changed, a reversible counter for intergrating the number of pulses from an oscillator in response to a first gate signal generated from said third means after said marker device has detected said position and subtracting the number of the pulses from the oscillator in response to a next gate pulse generated from said third means to detect the difference between said plurality of indication intervals, and means for shifting said table on which said second object to be measured is disposed in accordance with the content of said reversible counter for alignment between said first and second objects to be measured.

In the following, one embodiment of a scanning photoelectric microscope according to the present invention will be described in connection with FIGS. 6 to 9, which illustrate a system for aligning a first and a second object (60, 61) to be measured with respect to one axis of two-dimensional coordinates. The first object 60 to be measured, as shown in (a) of FIG. 7, includes a rectangular transparent window or aperture 62 and opaque portions 63 having a greatly reduced reflection factor to thus form a pattern plate for alignment. The second object 61 to be measured, as shown in (b) of FIG. 7, includes portions 64 having an excellent reflection factor due to regular reflection and a portion of strip 65 having a poor reflection factor due to irregular reflection to thus form a pattern plate for alignment having a sharp transition therebetween. The object 60 to be measured corresponds to an alignment target for a photographic mask in a mask-to-wafer alignment system while the object 61 to be measured corresponds to an alignment target for a semiconductor wafer in the mask-to-wafer alignment system. The first object 60 to be measured is absorbingly mounted in position on the aperture of a frame 67 fixed to a base 66 and remains stationary. On the other hand, the second object 61 to be measured is disposed on a table 70 effective to displacement on the base support 66 in response to rotation of a driving motor 69, and is arranged in superimposed relation to the first object 60 to be measured. Light emanating from a light source 72 connected to a power supply, passing through a converging lens 73, is reflected by a semitransparent mirror 74 and passes through an objective 75 to irradiate the first and second objects 60 and 61 to be measured. The light passing through the transparent window 62 of the first object 60 to be measured is changed on the surface of the second object 61 to be measured to reflected light, which passes through the objective 75 and the semitransparent mirror 74 to a prism 76. The prism 76, formed of a regular square pole is rotatably mounted on a revolving shaft 77 both ends of which are supported on a frame (not shown) of the microscope. At one end of the prism 76 there is provided a synchronous motor serving as a drive motor 78 for revolving the prism 76 at a constant speed in response to control signals from a driving device 79. At the other end of the prism 76 there are provided a disc 80, a photoelectric element 81, a light source 82 and a power supply connected to the light source 82. The disc 80 is secured to the revolving shaft 77 of the prism 76 and is formed with transparent windows or apertures 85 at a pitch of 90 degrees at four peripheral positions each corresponding to a central portion of adjacent corners 84 of the prism 76. As a result, the light emanating from the light source 82 passes through the transparent windows or apertures 85 to a photoelectric element 81. This causes a pulse signal serving as a marker signal to be generated from the photoelectric element 81 at each rotation of the prism by 90 degrees and transmitted to an amplifier 86. The light reflected from indication intervals $h_1$ and $h_2$ formed by the first and second objects 60 and 61 to be measured as shown in (c) of FIG. 7 and directed torward the prism 76 undergoes parallel displacement at a constant speed due to the variation of the angle of incidence after passing through the prism 76 and reaches a semitransparent mirror 87 because the prism 76 rotates at the uniform speed as mentioned above and the indication intervals $h_1$ and $h_2$ are very small. A portion of the scanned and reflected light passes through the semitransparent mirror 87 and the gap of the slit 88 to a photoelectric element 89. The photoelectric element 89 converts the scanned and reflected light to an electric signal, which is applied to an amplifier 90. The amplifier 90 amplifies the electric signal from the photoelectric element 89 and provides an output to a filter 91, which removes noises contained in the signal from the amplifier 90 and provides an output signal having a waveform as shown in (b) of FIG. 8 to a differential amplifier 92. On the other hand, the other portion of the scanned and reflected light is reflected by the semitransparent mirror 87 and passes through the gap of a slit 93 disposed in slightly phase-shifted relation to the slit 88 to a photoelectric element 94. The photoelectric element 94 converts the scanned and reflected light to an electric signal and provides an output to an amplifier 95. The amplifier 95 amplifies the electric signal from the photoelectric element 94 and provides an output to a filter 96, which then removes noises contained in the signal from the amplifier 95 and provides an output signal having a waveform as shown in (c) of FIG. 8 to the differential amplifier 92. The differential amplifier 92 amplifies a difference between the signal voltages from the filters 91 and 96 and provides an output signal having a waveform as shown in (d) of FIG. 8 to a zero-crossing detector 97. The zero-crossing detector 97 converts the signal from the differential amplifier 92 to a pulse signal having a waveform as shown in (e) of FIG. 8, which is applied to a flip-flop circuit 98. The flip-flop circuit 98 is triggered by the pulse signals from the zero-crossing detector 97 in synchronism with the rising and trailing portions of the signals from the filters 91 and 96 to convert the positional signals corresponding to the indication intervals $h_1$ and $h_2$ formed by the first and second objects 60, 61 to be measured to a signal having a waveform as shown in (f) of FIG. 8, which is applied to a flip-flop circuit 99 and AND gates 100 and 102, respectively. The flip-flop circuit 99 is triggered by the output signal from the flip-flop circuit 98 to apply a signal having a waveform as shown in (g) of FIG. 8 to an AND gate 100 and an inverter 101. In this case, it is to be noted that the flip-flop circuits 98 and 99 constitute a two-bit binary counter. The inverter 101 inverts the signal from the flip-flop circuit 99 to provide an output signal having a waveform as shown in (h) of FIG. 8 to the AND gate 102. An oscillator 103 employs a crystal oscillator free from errors resulting from temperature variations and generates a pulse signal of 1 MHz as shown in (k) of FIG. 8 which is applied to the AND gate circuits 100 and 102. On the other hand, the light emanating from the light source 82 passes through the transparent window or aperture 85 on the disc 80 secured to one end of the prism 76 and is converted to an electric signal by the photoelectric element 81 to generate marker signals. The marker signal is amplified by an amplifier 86 and shaped by a comparator 104. The signal then has its rising portion differentiated by a differential circuit 105 for conversion to a pulse signal having a waveform as shown in (a) of FIG. 8, which serves to reset the flip-flop circuits 98 and 99 and an up/down counter 106, respectively. The AND gate circuit 102 takes a logical product of the output signal from the flip-flop circuit 98 and that from the inverter 101 to seperate therefrom the first rectangular positional signal as shown in (i) of FIG. 8 corresponding to the indication interval $h_1$ formed by the first and second objects 60 and 61 to be meeasured. The pulse signal from the oscillator is applied to the up/down counter 106 as an up-count signal during a duration $t_1$ of the rectangular signal. At this time, the up/down counter 106 integrates the number of pulses in response to the input of the above-mentioned pulse signal during the duration $t_1$. The AND gate circuit 100, on the other hand, takes the logical product of the output signal from the flip-flop circuit 98 and that from the flip-flop circuit 99 to separate therefrom the second rectangular positional signal as shown in (j) of FIG. 8 corresponding to the indication interval $h_2$ formed by the first and second objects 60 and 61 to be measured. During a duration $t_2$ of the rectangular wave, the pulse signal from the oscillator 103 is applied to the up/down counter 106 as a down count gate signal. At this time, the up/down counter 106 subtract the pulse number corresponding to the duration $t_2$ from the registered pulse number corresponding to the duration $t_1$ to generate the pulse number corresponding to a time of $t_1 - t_2$. After the completion of the counting, the resultant $t_1 - t_2$ of the up/down counter is shifted to a memory latch circuit 108 in response to a latching pulse signal having a waveform as shown in (l) of FIG. 8 which is produced by differentiating the trailing portion of the output signal from the flip-flop circuit 99 by the differential circuit 107. The memory latch circuit 108 serves as a sample and hold circuit which retains therein the results of the preceding scanning during a time when the prism 76 effects the scanning and the up/down counter 108 counts while providing renewed contents in an instant when the counter receives the latching pulse signal from the differential circuit 107. A decision circuit 109 provides a signal to a pulse motor amplifier 110 in dependence on the numeral values and signs stored in the memory latch circuit 108. The pulse motor amplifier 110 receives the pulse signal from a variable frequency oscillator 111 in response to the command from the decision circuit 109 to operate the drive motor 69 serving as a pulse motor in either direction in order to shift the second object to be measured which is mounted on the table 70 in the right or left direction for alignment between the first and second objects 60 and 61.

Figure 6:
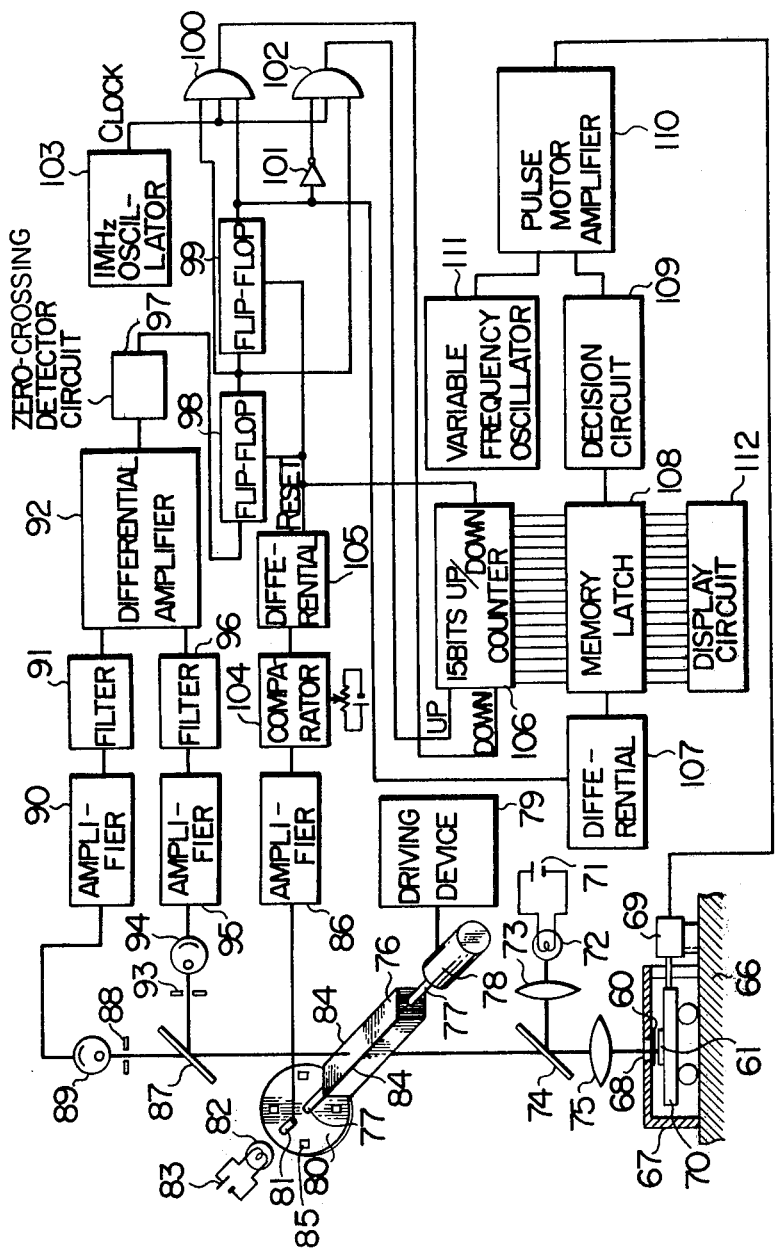
FIG. 6 is a block diagram showing one embodiment of arrangement of a scanning photoelectric microscope according to the present invention.
Figure 9:
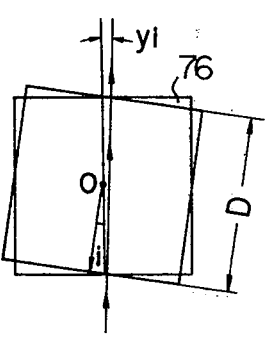
FIG. 9 is a view showing the relation between an angle of rotation of a prism used in the scanning photoelectric microscope of FIG. 6 and the displacement due to the scanning thereof.

Next, a description will be made of the scanning of the indication intervals $h_1$ and $h_2$ formed by the first and second objects 60 and 61 to be measured in connection with FIGS. 6 and 9. Let D be the thickness of the prism 76 having a square section, and $i$ the angle of rotation of the prism 76 obtained when each surface thereof is rotated about the shaft 77 of rotation of the prism, leaving the horizontal plane, and then the displacement $yi$ due to the scanning is given by the following expression (1), $$yi = D \sin i \left[ 1 - \frac{\cos i}{\sqrt{n^2 - \sin^2 i}} \right] \quad (1)$$

where $n$ is a refractive index.

When the angle $i$ of rotation is small, the displacement $yi$ is approximately given by an expression (2)
$$yi = D.i (1 - 1/n) \quad (2).$$

Assuming, for example, that the thickness D of the prism 76 is 14.2 millimeters, the refractive index $n$ thereof is 1.563 and the revolution N of the prism 76 is 375 r.p.m. (attained when a synchronous motor having a revolution of 375 r.p.m. is used as the drive motor 78), then the angle of rotation $i' \approx 0.1°$ and the scanning time $t_i \approx 0.05$ milliseconds are required to attain the scanned displacement $yi' = 10$ μm. Taking into consideration non-linearity of the prism 76, a maximum range y max to be scanned is assumed to be 5 millimeters for which a maximum time $t$ max $= 25$ milliseconds is required. the maximum range of y max $= 5$ millimeters to be scanned corresponds to a length of 0.5 millimeters in the first or second object to be measured because it is actually magnified ten times by the objective 75.

It will, on the other hand, be sufficient if the up/down counter 106 is permitted to operate at worst till $t$ max $= 25$ milliseconds, i.e., until the optical image over the maximum range to be scanned has been processed. Accordingly, the up/down counter 106 can count from $-32768$ to $+32767$ to measure the range to be scanned which corresponds to the scanning time $t = 32.7$ milliseconds without overflowing if the counter 106 uses one bit for a sign bit and 15 bits for actual count bits because it receives the pulse signal of 1 MHz from the oscillator 103.

Further, the up/down counter 106 is provided with a dead zone of several bits in order to prevent it from hunting because a pulse motor serving as the drive motor 69 is used to control the table 70 in on-off control modes. The operation in the dead zone is discriminated as follows: For convenience of simplification of the description, the total number of bits is assumed to be 5 bits of $X_5$, $X_4$, $X_3$, $X_2$ and $X_1$ inclusive of the sign bit with the dead zone constituted of the two lower bits. When $t_1 - t_2$ lies in the positive dead zone, the up/down counter 106 generates outputs of $X_5$, $X_4$ and $X_3$ all of which are "0", and when $t_1 - t_2$ lies in the negative dead zone, the counter generates $X_5$, $X_4$ and $X_3$ all of which are "1". If, accordingly, a logical expression $y = \overline{X}_5 . \overline{X}_4 . \overline{X}_3 + X_5 . X_4 . X_3$ becomes "1", then it indicates that the operation is in the dead zone, upon which a decision circuit 109 is controlled so that no pulse is applied to the pulse motor serving as the drive motor 69. It is to be noted that $\overline{X}_5$, $\overline{X}_4$ and $\overline{X}_3$ are produced by inverting $X_5$, $X_4$ and $X_3$ by inverters.

Further, the use of the pulse motor as the drive motor 69 requires accuracy in the frequency of pulses for driving the pulse motor. Thus, the use of the pulse motor and the on-off control due to the sampling impose a limitation upon the driving speed taking into consideration the accuracy in alignment and the time for alignment. Too fast drive results in the danger of passing through the dead zone prior to the sampling whereas the slow drive encounters no problem put results in much time being required for alignment. In these respects, the most suitable speed is considered to exist in the drive, so that the oscillator 111 employs the easy controllable unijunction transistor to make the speed variable. It is to be noted that the arrangement to control the frequency of the oscillator 111 depending on the errors in alignment generated from the up/down counter 106 serves to reduce the time required for alignment and to improve the accuracy in alignment.

A display circuit 112 serves to provide a binary display in accordance with the contents of a memory latch 108 by means of lamps. Accordingly, in a case of the time $t_1 < t_2$, the contents are displayed in the form of two's complement.

As mentioned above, the light reflected from the very small indication intervals $h_1$ and $h_2$ formed by the first and second objects 60 and 61 to be measured is scanned at the constant speed by the prism 76. A portion of the thus scanned and reflected light is detected by the photoelectric element 89 through the slit 88 and then amplified and shaped by the amplifier 90 and the filter 91 to generate the waveform as shown in (b) of FIG. 8 while the other portion thereof is detected by the photoelectric element 94 through the slit 93 and then amplified and shaped by the amplifier 95 and the filter 96 thereby to generate the waveform as shown in (c) of FIG. 8. Both the waveforms are slightly phase-shifted with each other by the slits 88 and 93 as shown in (b) and (c) of FIG. 8. The differential amplification of these output waveforms causes the differentially amplified signal having the waveform as shown in (d) of FIG. 8 to be produced which varies with the boundary or transition between the indication intervals $h_1$ and $h_2$. The signal is then shaped by the zero-crossing detector 97 to generate the signal having the waveform as shown in (e) of FIG. 8, which causes the flip-flop circuits 98, 99 each constituting the binary counter and the inverter 101 to generate the gate signal having the duration $t_1$ corresponding to the indication interval $h_1$ as shown in (i) of FIG. 8 and the gate signal having the duration $t_2$ corresponding to the indication interval $h_2$ as shown in (j) of FIG. 8. These gate signals causes the up/down counter 106 to count the difference between the number of pulses generated from the oscillator 103 during the duration $t_1$ and that generated therefrom during the duration $t_2$ for storage in the memory latch 108. The difference corresponds to the difference of dimension between the indication intervals $h_1$ and $h_2$. The drive motor 69 is controlled through the decision circuit 109 and the pulse motor amplifier 110 until the signal from the memory latch 108 becomes zero, that is, until the duration $t_1$ coincides with the duration $t_2$ to identify the indication intervals $h_1$ and $h_2$ formed by the first stationary object 60 to be measured and the second object 61 to be measured which is disposed on the table 70 for complete alignment between the first and second objects 60 and 61 to be measured.

Figure 8:
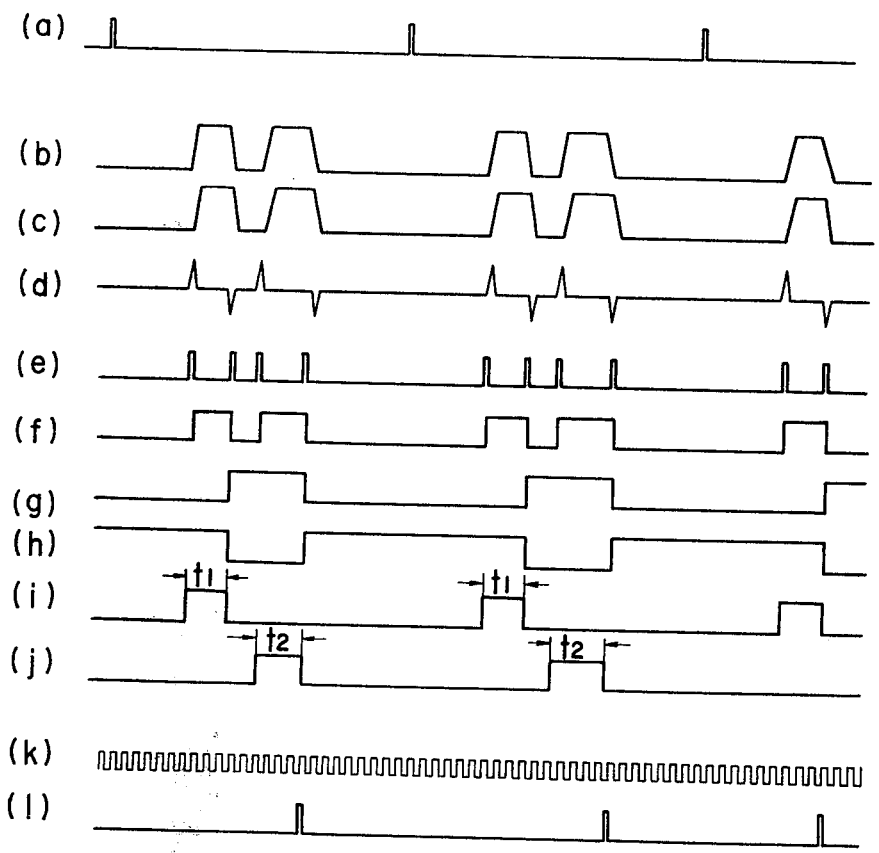
FIG. 8 is a view showing waveforms of signals generated from circuit elements in the scanning photoelectric microscope of FIG. 6.
Figure 10:
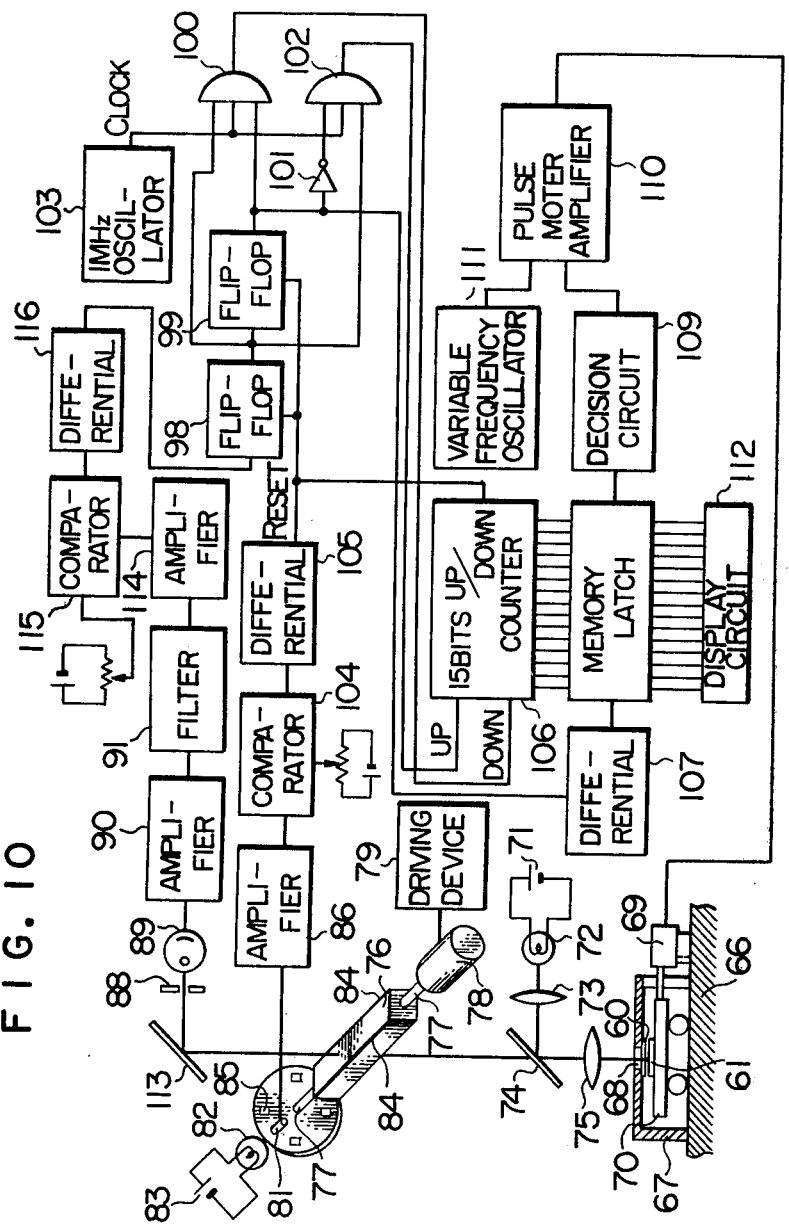
FIG. 10 is a view showing another embodiment of arrangement of a scanning photoelectric microscope according to the present invention.

FIG. 10 shows another embodiment of a scanning photoelectric microscope according to the present invention. The scanning photoelectric microscope of FIG. 10 has the same arrangement as that of FIG. 6 except that the semitransparent mirror 87 is replaced with a mirror 113; the system including the slit 93, the photoelectric element 94, the amplifier 95 and the filter 96 is removed therefrom; an amplifier 114 and a comparator 115 are connected in substitution for the differential amplifier 92; and the zero-crossing detector circuit 97 is replaced with a differential circuit 116. Accordingly, the signal from the filter 91 having the waveform as shown in (b) of FIG. 8 is amplified by the amplifier 114 and shaped to a rectangular wave by the comparator 115. The rectangular signal from the comparator 115 has its rising and trailing portions differentiated by the differential circuit 116 to generate the signal having the waveform as shown in (e) of FIG. 8, which is applied to the flip-flop circuit 98. The flip-flop circuit 98 is triggered by this signal to generate the positional signal having the waveform as shown in (f) of FIG. 8. It is to be noted that the differential circuit 116 disadvantageously produces a slight delay and is liable to effect erroneous operations due to noises.

The displacement $yi$ is approximately proportional to the angle $i$ of rotation of the prism 76 in view of the expression (1) established when the indication intervals formed by the first and second objects 60 and 61 to be measured are very small, and hence the indication intervals are respectively, proportional to the measured times obtained from the waveforms of ($i$) and ($j$) of FIG. 8 from the flip-flop circuits 98 and 99 constituting the binary counter. Accordingly, the indication intervals are measured by detecting the time to be measured by the counter on the assumption that a proportional constant is previously set.

Figure 11A:
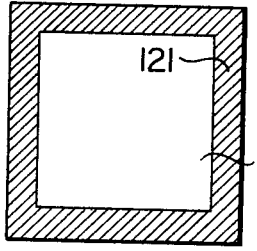
FIGS. 11a and 11b are views of patterns for alignment of first and second objects to be measured which are actually used in the mask alignment of a semiconductor integrated circuit.
Figure 11B:
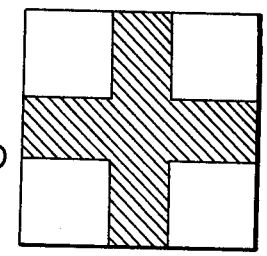

As mentioned above, the present invention permits the detection of the difference between the indication intervals formed by the first and second objects to be measured, and thus applicable also to the alignment in the semiconductor integrated circuit. In actual, the mash alignment in the semiconductor integrated circuit is required to effect three alignments of X and Y coordinates and an axis of rotation. Accordingly, the pattern for alignment of the first object 60 to be measured which serves as a mask is formed to include a square transparent window 120 and an opaque portion 121 surrounding the window as shown in (a) of FIG. 11, while the pattern for alignment of the second object 61 to be measured which serves as a semiconductor wafer is formed to include a dark cross-bank portion 122 provided with etching to effect irregular reflection, and a light portion 123 provided with no etching to effect regular reflection. This arrangement makes the mask alignment possible. In making the measurement of the relative difference between the two indication intervals for alignment, the first object to be measured is fixed in such a way that on the center of the gap of the slit there may be focused the center of the transparent window thereof which serves as a reference when the prism undergoes no rotation (i.e., when the parallel surfaces of the prism are positioned horizontal). Such an arrangement in the scanning photoelectric microscope according to the present invention permits the indication intervals to be compared with accuracy for accurate alignment even in a large object to be measured which has a great range to be scanned over which the displacement $yi$ of the scanned and reflected light is not proportional to the angle of rotation of the prism.

What we claim is:

1. A scanning photoelectric microscope adapted for use in measuring indication intervals of an object to be measured in terms of time, comprising first means for arranging a first object to be measured which is mounted on a stationary support and a second object to be measured which is disposed on a slidable table in slightly spaced apart and superimposed relationship to form a plurality of indication intervals in association with said first and second objects to be measured, a scanning device for scanning a reflected image of the indication intervals in said first means at a predetermined cycle to effect parallel displacement of said reflected image, second means including a photoelectric element for converting the scanned and reflected image which is passed through a slit from said scanning device into a signal, third means for amplifying and shaping said signal from said second means to generate gate signals corresponding to said plurality of indication intervals, respectively, a marker device for generating a marker signal each time when said scanning device recurrently scans said reflected image of said plurality of indication intervals, a reversible counter for integrating the number of pulses from an oscillator in response to a first gate signal generated from said third means after said marker device has generated said marker signal and subtracting the number of the pulses from the oscillator in response to a next gate pulse generated from said third means to detect the difference between said plurality of indication intervals, and means for shifting said table on which said second object to be measured is disposed in accordance with the content of said reversible counter for alignment between said first and second objects to be measured.

2. A scanning photoelectric microscope according to claim 1, wherein said scanning device includes a polygonal prism having parallel surfaces and scans said reflected image by passing said reflected image through said polygonal prism having parallel surfaces and rotating said prism at a constant speed to effect parallel displacement of said reflected image.

3. A scanning photoelectric microscope according to claim 2, wherein said first object to be measured is formed to include a transparent window and opaque portions adjacent to said window, and wherein said second object to be measured is formed to include regular reflective surfaces having an excellent reflection factor and an irregular reflective surface having a poor reflection factor, both ends of said irregular reflective surface being surrounded by said transparent window to form indication intervals in cooperation with a pair of said regular reflective surfaces having the excellent reflection factor.

4. A scanning photoelectric microscope according to claim 2, wherein said third means converts the signal from said second means to a pulse signal by differentiating the rising and trailing portions of said signal after amplification and shaping thereof, said pulse signal triggering flip-flop circuits serving as a binary counter, the outputs from which are processed with a logical product to generate the gate signals corresponding to said plurality of indication intervals.

5. A scanning photoelectric microscope according to claim 2, wherein a scanned and reflected image from said scanning device is divided by a semitransparent mirror towards a plurality of detectors including slits disposed in slightly phase-shifted relation to each other and photoelectric elements, an electric signal from each of said detectors being amplified and shaped for differential amplification with its rising and trailing portions thereof being converted to a pulse signal which triggers flip-flop circuits constituting a binary counter, each output from said flip-flop circuits being processed with a logical product to generate the gate signals corresponding to said plurality of indication intervals.

6. A scanning photoelectric microscope according to claim 2, wherein said means for shifting the table on which the second object to be measured is disposed for alignment employs a pulse motor having a pulse motor amplifier serving as a drive circuit connected to a variable frequency oscillator, the oscillation frequency of which is adjusted so as to control the shifting speed of said table in dependence on a positional displacement between said first and second objects to be measured.

7. A scanning photoelectric microscope according to claim 2, further comprising a decision circuit for rendering insensitive predetermined lower bits of the contents from said reversible counter.

8. A scanning photoelectric microscope comprising:
  a. first means for arranging a first object to be measured, which is mounted on a stationary support, and a second object to be measured, which is disposed on a table slidable with respect to said stationary support, in slightly spaced apart and superimposed relation to form a pair of indication intervals;
  b. a scanning device for scanning a reflected image of said pair of indication intervals, said scanning device including a polygonal prism having parallel faces for passing the reflected image of said pair of indication intervals and effecting parallel displacement thereto, driving means for driving said polygonal prism at a predetermined rotating speed and at least one stationary slit having a predetermined detecting width for passing said reflected image;
  c. a marker device for generating a marker signal each time when said scanning device recurrently scans said reflected image of said pair of indication intervals;
  d. second means including at least one photoelectric element for converting the reflected image passed through the slit into a pair of time interval signals corresponding to said pair of indication intervals;
  e. third means for detecting a difference between said time interval signals from said second means in response to a marker signal generated from said marker device; and
  f. fourth means for shifting said table so as to adjust the difference between said time interval signals to zero, whereby alignment between said first and second objects to be measured is obtained.

9. A scanning photoelectric microscope according to claim 8, in which said first object is composed of a transparent square window and an opaque pattern for alignment formed around the window and said second object is composed of a strip region having a narrower dimension than that of said window, consisting of a first reflection index region and a pattern for alignment formed to enclose the strip region, consisting of a second reflection index region having a different reflection index from the first reflection index.

10. A scanning photoelectric microscope according to claim 8, in which said first object is composed of an opaque strip region and a transparent pattern for alignment formed to enclose said strip region and said second object is composed of a square region having a wider dimension than the width of said strip region, consisting of a first reflection index region and a pattern for alignment formed to enclose said square region, consisting of a second reflection index region having a different reflection index from the first reflection index.

11. A scanning photoelectric microscope according to claim 8, in which said second means further comprises an amplifier circuit for amplifying a signal derived from said photoelectric element, a comparator circuit for shaping said signal from said photoelectric element into a rectangular wave having a predetermined threshold voltage, a differential circuit for differentiating the rising and trailing portions of the output wave from said comparator circuit and a pair of flip-flop circuits serving as a binary counter, which is reset by said marker signal generated from said marker device and is successively triggered by the signal derived from said differential circuit.

12. A scanning photoelectric microscope according to claim 11, in which said third means comprises an oscillator for generating a high frequency signal, a pair of AND circuits for taking an AND logical product between the respective output signals from said pair of flip-flops and a reversible counter which is reset by the marker signal from said marker device, calculates the number of pulse signals from one of said AND circuits and subtracts the number of pulse signals from the other of said AND circuits from said calculated number.

13. A scanning photoelectric microscope according to claim 8, in which said scanning device comprises a pair of stationary slits slightly phase-shifted to each other, each having a predetermined detecting width for passing said reflected image passed through said polygonal prism, and said second means includes a pair of photoelectric elements for converting the reflected image passed through each slit to a pair of electric signals, the photoelectric elements being positioned behind the slits.

14. A scanning photoelectric microscope according to claim 13, in which said second means further comprises a pair of amplifier circuits for amplifying the signals derived from said pair of photoelectric elements, respectively, a differential amplifier for taking a difference between the output voltages from the respective amplifier, a zero-crossing detector for providing a signal in accordance with the output from the differential amplifier and flip-flop circuits serving as a binary counter, which is reset by said marker signal generated from said marker device and is successively triggered by the signal derived from said zero-crossing detector.

15. A scanning photoelectric microscope according to claim 8, in which said marker device generates the same number of marks as that of the faces of said polygonal prism with predetermined pitches and comprises a disk rotating in synchronism with said polygonal prism and detecting means for detecting and converting the marks into electric signal.

16. A scanning photoelectric microscope according to claim 15, in which said third means comprises an oscillator for generating a high frequency signal, a pair of AND circuits for taking an AND logical product between the output signals from said pair of flip-flop circuits and a reversible counter which is reset by the marker signal from said marker device, calculates the number of pulse signals from one of said AND circuits and subtracts the number of pulse signals from the other of said AND circuits from said calculated number.

17. A scanning photoelectric microscope according to claim 8, in which said fourth means includes a pulse motor provided as driving means for shifting a table on which the second object is carried, a pulse motor amplifier for driving said pulse motor, and a variable frequency oscillator connected with said pulse motor amplifier, the oscillating frequency of said variable frequency oscillator being adjusted so as to control the shifting speed of the table in dependence upon the amount of displacement of alignment between said first object and said second object.

18. A scanning photoelectric microscope according to claim 8, wherein one of the first and second objects is provided with a strip region which is positioned substantially parallel to a window provided on the other of the first and second objects, the strip region serving to divide the area within the window into a pair of intervals.

* * * * *